MULTICHANNEL FREQUENCY SYNTHESIZER

Filed March 26, 1963 2 Sheets-Sheet 1

INVENTORS
JULIUS GUTTMAN
JONAS M. SHAPIRO
BY Glenn S. Porevik Agent
Richard Reed
ATTORNEY INVENTORS
JULIUS GUTTMAN
JONAS M. SHAPIRO
BY Glenn S. Ovrevik Agent.
Richard C. Reed
ATTORNEY 3,208,005
Patented Sept. 21, 1965

3,208,005

MULTICHANNEL FREQUENCY SYNTHESIZER

Julius Guttman, White Plains, N.Y., and Jonas M. Shapiro, Stamford, Conn., assignors, by mesne assignments, to the United States of America as represented by the Secretary of the Navy Filed Mar. 26, 1963, Ser. No. 268,165
1 Claim. (Cl. 331—2)

This invention relates in general to radio frequency oscillators. More particularly, this invention relates to a radio frequency oscillator which produces a readily and continuously variable output of highly stable frequencies of 16 to 32 megacycles per second.

A first object of this invention is the provision of a radio frequency oscillator which produces a readily and continuously variable output of 16 to 32 megacycles per second.

A second object of this invention is the provision of a radio frequency oscillator which produces a readily and continuously variable output of 16 to 32 megacycles per second having a high stability dependent upon a highly stable crystal controlled oscillator.

A third object of this invention is the provision of a radio frequency oscillator which produces a readily and continuously variable output of 16 to 23 megacycles per second having a stability of one part in $10^8$ per day.

A fourth object of this invention is the provision of a radio frequency oscillator which produces a readily and continuously variable output of 16 to 32 megacycles per second and which utilizes an internal one megacycle reference oscillator to discipline the output frequencies by locking them to said reference oscillator.

Still another object of this invention is the provision of a radio frequency oscillator which produces a readily and continuously variable output of 16 to 32 megacycles per second and which includes three free-running variable frequency oscillators in a double-conversion type of circuit, each variable frequency oscillator being disciplined through phase detector fed reactances by a one megacycle reference frequency.

Other objects of this invention will become apparent upon a more comprehensive understanding of the device.

Figure 1:
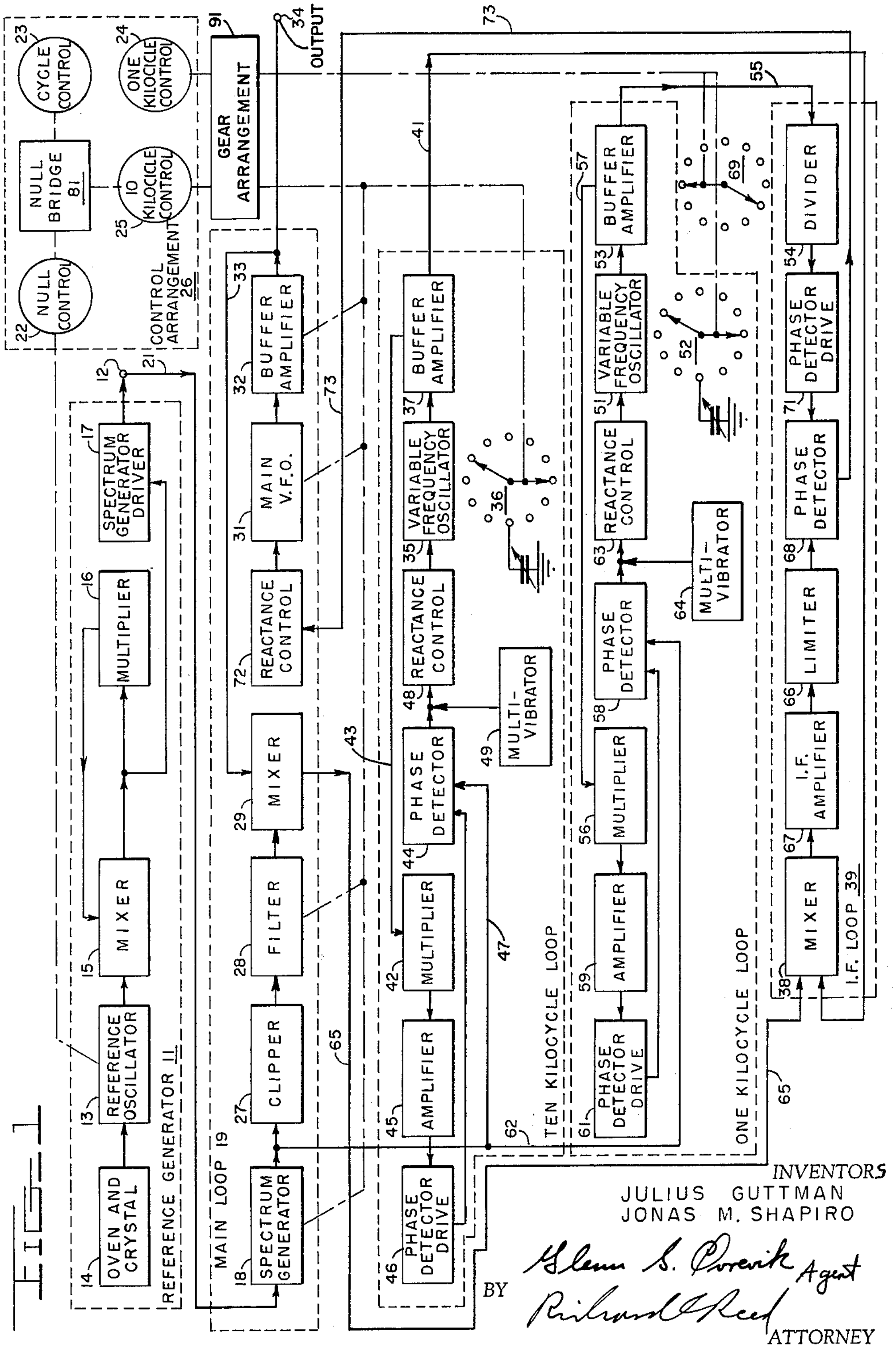
Figure 2:
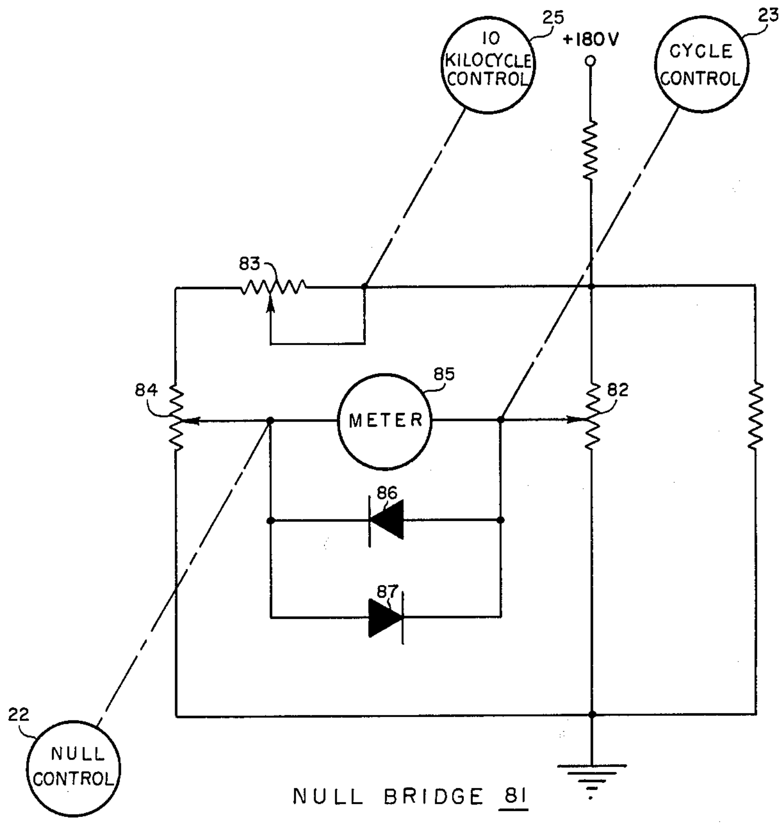

In order that the invention may be readily carried into effect, it will now be described with reference to the accompanying drawing, wherein:

FIG. 1 is a schematic block diagram of an embodiment of the radio frequency oscillator of the present invention; and FIG. 2 is a schematic circuit diagram of an embodiment of a circuit arrangement which may be utilized as the control arrangement 26 of the radio frequency oscillator of FIG. 1.

A reference generator circuit 11 produces a 100 kilocycle per second sine wave signal at its output terminal 12. The reference generator circuit 11 comprises a reference oscillator 13 which is a crystal-controlled oscillator controlled by an oven controlled crystal 14. The high stability reference oscillator 13 may comprise any suitable oscillator known in the art, such as, for example, a Meacham type oscillator. A suitable high stability reference oscillator may comprise, for example, that shown and described in pages 1278 through 1294 of "The Bridge-Stabilized Oscillator," by L. A. Meacham, Proceedings of the Institute of Radio Engineers, volume 26, number 10, October 1938.

The reference oscillator 13 produces a highly stable one megacycle per second signal which is amplified and applied to a mixer 15. The 100 kilocycle sine wave signal produced at the output terminal 12 of the reference generator circuit arrangement 11 is derived from the reference oscillator 13 by the mixer 15. The mixer 15 may comprise any suitable circuit known in the art, such as that shown in FIG. 10–16, page 528, of "Radio Engineering," by F. E. Terman, third edition, 1947, McGraw-Hill Book Company, Inc.

The mixer 15 is connected in a feedback loop with a multiplier circuit 16. The multiplier circuit 16 may comprise any suitable frequency multiplier circuit known in the art, such as that shown in FIG. 7–30, page 394, of the aforementioned "Radio Engineering" textbook. The mixer 15-multiplier 16 loop operates as a regenerative divider, in a manner known in the art, to convert the one megacycle per second sine wave signal supplied by the reference oscillator 13 to a 100 kilocycle per second sine wave output signal. This is achieved by the multiplier circuit 16, which multiplies the 100 kilocycle per second output signal of the mixer 15 by three to produce a 300 kilocycle per second signal and multiples the 300 kilocycle per second signal by three again to produce a 900 kilocycle per second signal. The 900 kilocycle per second signal is mixed with the one megacycle per second signal in the mixer 15 to produce a 100 kilocycle per second sine wave signal which is applied through spectrum generator driving circuit 17 to the output terminal 12. The spectrum generator driving circuit 17 may comprise any suitable driving stage comprising amplifying means known in the art, such as the circuit arrangement shown in chapter V, page 167, "Radio Engineering," by F. E. Terman, second edition, 1937.

The 100 kilocycle per second sine wave signal is supplied through the spectrum generator driving circuit 17 to a spectrum generator 18 of a main loop 19 through a connecting line 21. The spectrum generator 18 produces 100 kilocycle per second output pulses in a limited range of outputs from 20.4 megacycles per second to 38.4 megacycles per second. The spectrum generator 18 may comprise any suitable spectrum generator circuit known in the art, such as a conventional ringing circuit. A suitable spectrum generator may comprise, for example, that shown in FIG. 4.42, page 141, of "Waveforms," edited by Chance, Hughes, MacNichol, Sayre, and Williams, Massachusetts Institute of Technology, Radiation Laboratory Series, volume 19, first edition, 1949, McGraw-Hill Book Company, Inc.

Mechanical controls 22, 23, 24, and 25 are included in a control arrangement 26 and are manually set at a desired frequency, which is indicated on a front panel (not shown) on which said controls are provided.

The output pulses of the spectrum generator 18 are clipped in any suitable clipper circuit 27 known in the art, such as, for example, that shown in "Radar Electronic Fundamentals," NAVSHIPS, 900,016, June 1944, page 160. The negative pulses derived from the clipper 27 are supplied to a filter 28 of any suitable type known in the art, such as that described in paragraphs 3–6, pages 69 to 71, of the aforementioned "Radio Engineering" textbook. The filter 28 determines the output frequency of the spectrum generator 18 and said spectrum generator and filter are mechanically controlled by the kilocycle control 25 since they comprise variable capacitors which are mechanically ganged to said control.

Thus, when the 10 kilocycle control 25 and the one kilocycle control 24 are jointly set at a desired frequency of, for example, 16,000,000 cycles per second, the output signal of the filter 28 is set at 4.4 megacycles above the desired 16 megacycle per second frequency, or 20.4 megacycles per second. This is achieved because the filter 28 comprises tuned bandpass filters which are set at 4.4 megacycles per second above the desired frequency before division in all cases. The 20.4 megacycle output signal from the filter 28 is supplied to a mixer 29. The mixer 29 may comprise any suitable mixer known in the art, such as that shown on page 528 of the aforementioned "Radio Engineering" textbook.

A main variable frequency oscillator 31 produces a sine wave output of 16 megacycles per second in the illustrative example under the mechanical control of the control 25. The main variable frequency oscillator 31 may comprise any suitable variable frequency oscillator known in the art, such as that shown in FIG. 8–1*a*, page 410, of the aforementioned "Radio Engineering" textbook. The output signal of the variable frequency oscillator 31 is supplied to the mixer 29 through a buffer amplifier circuit 32 and a connecting line 33. The buffer amplifier circuit functions as a buffer between external variations and the main variable frequency oscillator 31 so that it prevents instability of said oscillator by preventing loading of the said oscillator. The buffer amplifier circuit may comprise any suitable buffer circuit known in the art, such as that shown in chapter 7 of the aforementioned "Radio Engineering" textbook, e.g., FIG. 7–13, page 356. The output of the buffer 32 is supplied to an output terminal 34.

The mixer 29 produces, in the illustrative example, an output signal which is the difference between the 20.4 megacycle per second input from the filter 28 and the 16 megacycle per second input from the buffer 32 and therefore produces a 4.4 megacycle per second output signal. The 4.4 megacycle per second output signal of the mixer 29 constitutes the first IF frequency.

In the depicted embodiment, the 100 kilocycle per second output pulse signal of the spectrum generator 18 is supplied to two secondary loops, the 10 kilocycle loop and the one kilocycle loop. The 10 kilocycle loop functions to discipline the main variable frequency oscillator 31 in 10 kilocycle steps and the one kilocycle loop functions to discipline said main variable frequency oscillator in one kilocycle steps.

A variable frequency oscillator 35 produces a sine wave output signal of 4 megacycles per second, in the illustrative example, under the mechanical control of the 10 kilocycle control 25. The variable frequency oscillator 35 may comprise any suitable variable frequency oscillator known in the art, such as that shown on page 410 of the aforementioned "Radio Engineering" textbook. The 10 kilocycle loop functions to tune 100 kilocycles per second down by tens. This is achieved by the use of a 10 kilocycle increment rotary switch 36. The variable frequency oscillator 35 is set at 4 megacycles per second, in the illustrative example, by the rotary switch 36 under the mechanical control of the control 25. The rotary switch 36 comprises a plurality of contacts which provide frequencies separated by 10 kilocycles from each other. Thus, in the embodiment shown, the rotary switch 36 comprises 10 contacts, each being grounded through a variable capacitor so that a fixed predetermined frequency is available at each of said contacts. The 4 megacycles (4,000,000 cycles) per second is varied in 10 kilocycle (10,000 cycles) increments so that 4.000, 3.990, 3.980, 3.970, 3.960, 3.950, 3.940, 3.930, 3.920 and 3.910 megacycles per second are respectively available at successive contacts of the rotary switch 36 from the first position to the tenth position. To aid in the clarity of presentation, the variable capacitors connected to each of the 10 contacts of the rotary switch 36 are not shown; only a single one of the connections being shown. The variable frequency oscillator 35 is connected to a rotary arm of the rotary switch 36 which is rotated under the control of the 10 kilocycle control 25 to contact the contacts of said rotary switch sequentially until selection of the desired frequency.

The 4 megacycle output signal of the variable frequency oscillator 35 is supplied through a buffer amplifier circuit 37 to a mixer 38 of an IF loop through a connecting line 41 and to a multiplier circuit 42 through a connecting line 43. The multiplier circuit 42 may comprise any suitable multiplier known in the art, such as that shown on page 394 of the aforementioned "Radio Engineering" textbook. The multiplier circuit 42 multiplies the 4 megacycle output signal of the variable frequency oscillator 35 by ten to produce a 40 megacycle per second signal. The 40 megacycle per second output signal of the multiplier circuit 42 is supplied to a pulse driven phase detector 44 through an amplifier 45 and a phase detector driving circuit 46. The amplifier 45 and the phase detector driving circuit 46 may comprise any suitable amplifier circuits known in the art such as those shown in chapter 7 of the aforementioned "Radio Engineering" textbook, e.g., on page 345.

The 100 kilocycle per second pulses produced by the spectrum generator 18 are also supplied to the phase detector 44 through a connecting line 47. The phase detector 44 produces a D.C. output voltage which controls the variable frequency oscillator 35 through a reactance control 48 and serves to lock in said variable frequency oscillator. The reactance control 48 may comprise any suitable oscillator control means, such as that shown in FIG. 13.15, page 249, of "Radio Receiver Design," by K. R. Starly, Part II, fifth edition, 1949, John Wiley and Sons.

The phase detector 44 may comprise any suitable type known in the art and preferably incorporates a coil wound in such fashion that its self-capacities are balanced out. It functions to convert a pulse signal and a sine wave signal into a D.C. potential which varies in magnitude as the phase of the two signals in relation to each other varies. The D.C. potential is applied to the reactance control 48 across the variable frequency oscillator 35 and holds said oscillator under phase control. A suitable phase detector may comprise, for example, that shown in FIG. 14.13, page 512, of the aforementioned "Waveforms" textbook.

When the variable frequency oscillator 35 is "captured" or "held in" at a desired frequency, it will remain "captured" over a considerable mechanical detuning of said oscillator. When the variable frequency oscillator 35 "falls out" of its "captured" or "held in" state, it cannot be easily "captured" or "pulled in." A multivibrator 49 functions to make the "pull in" range of the variable frequency oscillator 35 equal to the "hold in" range of said oscillator. This is due to the fact that when the variable frequency oscillator is not in the "captured" state, the feedback loop exhibits a noise voltage which is equivalent to a high impedance line. A multivibrator having a grid impedance common to the feedback loop sees the high impedance and becomes conductive at a very slow repetition rate. The multivibrator 49 signal sweeps the variable frequency oscillator 35 into the very small natural "pull in" range of the phase detector 44 and "captures" said oscillator. When the variable frequency oscillator 35 is in the "captured" state, the feedback loop exhibits a zero potential or a zero impedance. The multivibrator 49 sees the zero impedance and becomes nonconductive and the variable frequency oscillator 35 remains in the "captured" state. Thus, the multivibrator sensing of the feedback loop impedance extends the "pull in" range to the "hold in" range and provides a safety factor of ten or more over the natural stability of the variable frequency oscillator 35 under phase control.

A variable frequency oscillator 51 produces a sine wave output signal of 4 megacycles per second in the illustrative example under the mechanical control of the one kilocycle control 24. The variable frequency oscillator 51 may comprise any suitable variable frequency oscillator known in the art, such as that shown on page 410 of the aforementioned "Radio Engineering" textbook. The one kilocycle loop functions to tune 100 kilocycles per second down by ones. This is achieved by the use of a 10 kilocycle increment rotary switch 52. The variable frequency oscillator 51 is set at 4 megacycles per second in the illustrative example by the rotary switch 52 under the mechanical control of the control 24. The rotary switch 52 comprises a plurality of contacts which provide frequencies separated by 10 kilocycles from each other. Thus, in the embodiment shown, the rotary switch 52 is similar to the rotary switch 36 and functions in a similar manner. The variable frequency oscillator 51 is connected to a rotary arm of the rotary switch 52 which is rotated under the control of the one kilocycle control 24 to contact the contacts of said rotary switch 52 sequentially until selection of the desired frequency.

The 4 megacycle output signal of the variable frequency oscillator 51 is supplied through a buffer amplifier 53 to a divider circuit 54 of the IF loop 39 through a connecting line 55 and to a multiplier circuit 56 through a connecting line 57. The multiplier circuit 56 may comprise any suitable frequency multiplier known in the art, such as that shown on page 394 of the aforementioned "Radio Engineering" textbook. The multiplier circuit 56 multiplies the 4 megacycle output signal of the variable frequency oscillator 51 by ten to produce a 40 megacycle per second signal. The 40 megacycle per second output signal of the multiplier circuit 56 is supplied to a pulse driven phase detector 58 through an amplifier 59 and a phase detector driving circuit 61. The amplifier 59 and the phase detector driving circuit 61 may comprise any suitable amplifier circuits known in the art, such as those shown in chapter 7 of the aforementioned 'Radio Engineering" textbook, e.g., on page 345.

The 100 kilocycle per second pulses produced by the spectrum generator 18 are also supplied to the phase detector 58 through the connecting line 62. The phase detector 58 produces a D.C. output voltage which controls the variable frequency oscillator 51 through a reactance control 63 and serves to lock in said variable frequency oscillator. The reactance control 63 may comprise any suitable oscillator control means, such as that shown on page 249 of the aforementioned "Radio Receiver Design" textbook, Part II.

The phase detector 58 may comprise any suitable type known in the art and is similar to the phase detector 44 and functions in a similar manner. A suitable phase detector may comprise, for example, that shown on page 512 of the aforementioned "Waveforms" textbook. It functions to convert a pulse signal and a sine wave signal into a D.C. potential which varies in magnitude as the phase of the two signals in relation to each other varies. The D.C. potential is applied to the reactance control 63 and holds the variable frequency oscillator 51 under phase control.

When the variable frequency oscillator 51 is "captured" or "held in" at a desired frequency, it will remain "captured" over a considerable mechanical detuning of said oscillator. When the variable frequency oscillator 51 "falls out" of its "captured" or "held in" state, it cannot be easily "captured" or "pulled in." A multivibrator 64, which is similar to the multivibrator 49 and functions in a similar manner, functions to make the "pull in" range of the variable frequency oscillator 51 equal to the "hold in" range of said oscillator. This is due to the fact that when the variable frequency oscillator 51 is not in the "captured" state, the feedback loop exhibits a noise voltage which is equivalent to a high impedance line. A multivibrator having a grid impedance common to the feedback loop sees the high impedance and becomes conductive at a very slow repetition rate. The multivibrator 64 signal sweeps the variable frequency oscillator into the very small natural "pull in" range of the phase detector 58 and "captures" said oscillator. When the variable frequency oscillator 51 is in the "captured" state, the feedback loop exhibits a zero potential or a zero impedance. The multivibrator 64 sees the zero impedance and becomes non-conductive and the variable frequency oscillator 51 remains in the "captured" state. Thus, the multivibrator sensing of the feedback loop impedance extends the "pull in" range and provides a safety factor of ten or more over the natural stability of the variable frequency oscillator 51 under phase control.

The 4.4 megacycle per second output signal in the illustrative example of the mixer 29, which constitutes the first IF frequency, and the 4 megacycle per second output signal of the variable frequency oscillator 35, which is supplied through the buffer amplifier circuit 37 and which constitutes the second IF frequency, are supplied to the mixer 38 of the IF loop 39. The mixer 38 may comprise any suitable mixer arrangement known in the art, such as that shown on page 528 of the aforementioned "Radio Engineering" textbook. The mixer 38 produces an output signal which is the difference between the 4.4 megacycle signal from the mixer 29, supplied through a connecting line 65, and the 4 megacycle signal supplied through the connecting line 41 from the buffer amplifier circuit 37 and therefore produces a 0.4 megacycle (400,000 cycles) per second output signal.

The 0.4 megacycle signal produced by the mixer 38 is supplied to a limiter 66 through an IF amplifier stage 67. The limiter 66 and the IF amplifier stage may comprise any suitable limiter and amplifier circuit arrangements, respectively, known in the art. A suitable limiter may comprise, for example, that shown in FIG. 15.9, page 330, of the aforementioned "Radio Receiver Design" textbook, Part II, and a suitable IF amplifier stage may comprise, for example, that shown on page 345 of the aforementioned "Radio Engineering" textbook. The 0.4 megacycle output signal of the limiter 66 is supplied to a phase detector 68. Since the phase detector 68 is susceptible to amplitude variations, the limiter 66 functions to limit the 0.4 megacycle sine wave signal received from the IF amplifier stage 67 in amplitude to produce a constant amplitude voltage in a manner known in the art, which constant amplitude 0.4 megacycle voltage is supplied to said phase detector.

The 4 megacycle per second output signal of the variable frequency oscillator 51, which is supplied through the buffer amplifier circuit 53, is supplied to the divider circuit 54 of the IF loop 39 through the connecting line 55. The divider circuit 54 is known in the art as a locked divider. The divider circuit 54 may comprise any suitable frequency divider arrangement known in the art, such as that shown in "Modified Locked Oscillator Frequency Dividers," IRE Proceedings, December 1951, pages 1535, 1536. A suitable divider circuit may comprise, for example, a multigrid tube, of which one set of grids functions as a free-running variable frequency oscillator in a manner well known in the art. Thus, the variable frequency oscillator of the locked divider 54 is set at 400 kilocycles per second when the locking signal is 4 megacycles per second. Since the two signals are harmonically related, and the 4 megacycle signal is a crystal controlled signal from the variable frequency oscillator 51, the 400 kilocycle or 0.4 megacycle signal locks to the 4 megacycle signal.

The one kilocycle loop of the variable frequency oscillator 51 functions to tune 10 kilocycles down by ones. This is achieved by the use of a one kilocycle increment switch 69. The divider circuit 54 divides the 4 megacycle output signal of the variable frequency oscillator 51 by ten to produce a 0.4 megacycle per second signal with the assistance of the rotary switch 69. The divider circuit 54 is set at 0.4 megacycle per second by the rotary switch 69 under the mechanical control of the one kilocycle control 24. The rotary switch 69 comprises a plurality of contacts which provide frequencies which are separated by one kilocycle from each other. Thus, in the embodiment shown, the rotary switch 69 comprises ten contacts, each being grounded through a variable capacitor so that a fixed predetermined frequency is available at each of said contacts. The 0.4 megacycle per second is varied in one kilocycle increments so that 0.400 (400,000 kilocycles per second), 0.399, 0.398, 0.397, 0.396, 0.395, 0.394, 0.393, 0.392, and 0.391 megacycle per second are respectively available at successive contacts of the rotary switch 69 from the first position to the tenth position. To aid in the clarity of presentation, the variable capacitors connected to each of the ten contacts of the rotary switch 69 are not shown; only a single one of the connections being shown. The divider circuit 54 is connected to a rotary arm of the rotary switch 69 which is rotated under the control of the one kilocycle control 24 to contact the contacts of said rotary switch 69 sequentially until selection of the desired frequency.

The 0.4 megacycle per second output signal from the divider circuit 54 is supplied to the phase detector 68 through a phase detector driving circuit 71. The phase detector driving circuit 71 may comprise any suitable amplifier circuit known in the art, such as that shown in chapter 7 of the aforementioned "Radio Engineering" textbook, e.g., on page 345.

The phase detector 68 may comprise any suitable type known in the art and is similar to the phase detectors 44 and 58 and functions in a similar manner. A suitable phase detector may comprise, for example, that shown on page 512 of the aforementioned "Waveforms" textbook. A preferred phase detector is that disclosed in United States Patent No. 2,871,349, issued to J. M. Shapiro on January 27, 1959. It functions to convert the 0.4 megacycle output signal of the limiter 66 and the 0.4 megacycle output signal of the divider circuit 54 into a D.C. potential which varies in magnitude as the phase of the two signals in relation to each other varies. The D.C. potential is applied to a reactance control 72 through a connecting line 73 and holds the main variable frequency oscillator 31 under phase control. The reactance control 72 may comprise any suitable oscillator control means, such as that shown on page 249 of the aforementioned "Radio Receiver Design" textbook, Part II.

The 16 megacycle per second output signal of the main variable frequency oscillator 31 is supplied to the output terminal 34 through the buffer amplifier 32.

FIG. 2 is an embodiment of a circuit arrangement which may be utilized as the control arrangement 26 of the radio frequency oscillator of the present disclosure as shown in FIG. 1. The embodiment of FIG. 2 comprises a null bridge 81, the null control 22 mechanically coupled thereto, the cycle control 23 mechanically coupled thereto and the 10 kilocycle control 25 mechanically coupled thereto. The one kilocycle control 24 is not connected to the null bridge 81 either electrically or mechanically.

The null bridge 81 comprises a bridge network which includes three potentiometers 82, 83, and 84, a null balance meter 85, and surge protectors 86 and 87. Each of the potentiometers 82, 83, and 84 is mechanically coupled to a front panel (not shown) on which the null control 22, the cycle control 23, the one kilocycle control 24 and the 10 kilocycle control 25 are provided in the form of knobs or dials.

The control knobs are mechanically coupled to number indicators which indicate the frequency output of the radio oscillator of the present disclosure. The operator moves the control knobs in the following manner until the desired or selected output frequency is shown on the number indicators. The number indicators show eight digits, so that the frequency is indicated in cycles.

The potentiometer 82 is the cycles control and is mechanically coupled to the cycle control 23, setting the final three digits of the front panel number indicators. The potentiometer 83 is the 10 kilocycle control and is mechanically coupled to the 10 kilocycle control 25. The potentiometer 84 is the null balance control and is mechanically coupled to the null balance control 22. The null balance control 22 is mechanically coupled to the tuning capacitor of the reference variable frequency oscillator 13, so that said reference is tuned under the control of said null balance control. The null balance control potentiometer 84 balances the bridge circuit and is adjusted for a zero reading on the null balance meter 85.

The null bridge 81 is unbalanced by either the changing of the frequency output of the radio frequency oscillator arrangement of the present disclosure, at the output terminal 34, in 10 kilocycle steps or in cycles. When the cycles control potentiometer 82 is varied, thereby changing the numbers indication, the output frequency of the radio frequency oscillator, at the output terminal 34, must likewise be adjusted. This is accomplished by readjusting of the null balance control potentiometer 84 so that the frequency of the reference variable frequency oscillator 13 (one megacycle per second) is correctly altered.

The null bridge arrangement 81 of FIG. 2 is preferably constructed in a manner whereby all the potentiometers thereof are equal in value and the first arm of the null bridge consists of the cycles control potentiometer 82 and the second arm of the null bridge consists of the 10 kilocycle control potentiometer 83 and the null balance control potentiometer 84 connected in series circuit arrangement with said 10 kilocycle control potentiometer. When the 10 kilocycle control 25 is set at 16 megacycles per second, the 10 kilocycle control potentiometer 83 is short circuited and the entire B+ voltage, typically +180 volts as shown, appears across the null balance control potentiometer 84 in the second arm of the bridge and across the cycles control potentiometer 82 the first arm of the bridge. The operation of potentiometer 82 at the midposition requires the setting of the null balance control potentiometer 84 at the midposition.

At 32 megacycles per second, the voltage across the second arm of the bridge is equally divided between the 10 kilocycle control potentiometer 83 and the null balance control potentiometer 84, so that the voltage across the cycles control potentiometer 82 in the first arm of the bridge is twice the voltage across said null balance control potentiometer. Consequently, setting the cycles control potentiometer 82 at the quarter-position requires the setting of the null balance control potentiometer 84 at the midposition. The action of the 10 kilocycle control potentiometer 83 thus assures that the frequency change made by the null balance control 22 in the one megacycle reference variable frequency oscillator 13 correctly compensates for the coarse setting of the output frequency of the radio frequency oscillator (16 to 32 megacycles per second) using the 10 kilocycle control 25, and the ratio of change between said reference oscillator frequency and the radio frequency oscillator output frequency, at the output terminal 34, necessarily remains constant.

The 10 kilocycle control 25 is mechanically coupled to the spectrum generator 18, the filter 28, the main variable frequency oscillator 31, the buffer amplifier 32 and the rotary switch arrangement 36. The one kilocycle control 24 is mechanically coupled to the rotary switch 52 and 69. The null balance control 22 is mechanically coupled to the reference variable frequency oscillator 13. The one kilocycle control 24 and the 10 kilocycle control 25 are mechanically coupled to the aforementioned components through a sutiable gear arrangement 91 (shown in FIG. 1).

The gear arrangement 91 may comprise any suitable type of coupling arrangement known in the art which is adapted to control the mechanical adjustment of elements of the various units in accordance with mechanical adjustment of the controls 24 and 25. Thus, if the desired output signal is 16 megacycles per second, the operator turns the controls (control knobs) 24 and 25 until the numeral indicators on the front panel read 16000000. When the controls 24 and 25 are moved to the 16000000 indication, the gear arrangement 91 moves a variable capacitor in the spectrum generator 18 and a variable capacitor in the filter 28 to produce a 20.4 megacycle per second output at said filter and the capacitor of the buffer amplifier 32 is moved to tune said buffer amplifier to 16 megacycles per second; the rotary switch 36 is moved to the 4.0 megacycle per second position to apply such frequency to the tuned circuit of the variable frequency oscillator 35; the tuned circuit of the main variable frequency oscillator 31 is moved to tune said oscillator to 16 megacycles per second. The gear arrangement 91 moves the rotary switch 52 arm to the 4.0 megacycle per second position to apply such frequency to the tuned circuit of the variable frequency oscillator 51 and the rotary switch 69 arm is moved to the 0.4 megacycle per second position to apply such frequency to the tuned circuit of the divider 54.

Thus, when the desired output frequency at the output terminal 34 is 16.0 megacycles (16,000,000 cycles) per second, the front panel (not shown) controls are set to 16000000 and thus the main variable frequency oscillator 31 and the buffer amplifier 32 are set at 16 megacycles per second and the spectrum generator 18 and filter 28 are set at 20.4 megacycles per second. This produces the first IF of 4.4 megacycles per second. The 10 kilocycle loop variable frequency oscillator 35 is tuned to 4 megacycles per second, multiplied to 40 megacycles per second and compared in phase with the reference frequency of 100 kilocycle per second pulses. The one kilocycle loop variable frequency oscillator 51 is also tuned to 4 megacycles per second, multiplied to 40 megacycles per second and supplied to the phase detector 58 with the 100 kilocycle per second reference frequency pulses. The 4 megacycle per second output of the 10 kilocycle loop is mixed with the first IF of 4.4 megacycles per second to produce the second IF of 400 kilocycles per second. The 4 megacycle per second output of the one kilocycle loop is divided by ten to 400 kilocycles per second and supplied to the phase detector 68 with the 400 kilocycle per second IF.

When the desired or selected frequency is changed from 16 megacycles per second to 16.1 megacycles (16,000,000 cycles) per second, the front panel 10 kilocycle control 25 is set to 16.1 megacycles per second and the main variable frequency oscillator 31 and the buffer amplifier 32 are tuned to 16.1 megacycles per second. Consequently, the spectrum generator 18 and filter 28 are tuned to 20.5 megacycles per second (4.4 megacycles greater than 16.1 megacycles) and produce the first IF of 4.4 megacycles per second. The 10 kilocycle loop remains tuned to 4.000 megacycles per second, because it can be varied only in 10 kilocycle steps, and the one kilocycle loop variable frequency oscillator 51 also remains unchanged. Thus, the main variable frequency oscillator 31 is directly tuned to 16,100,000 cycles per second and is disciplined by the output of the phase detector 68.

When the desired or selected frequency is changed to 16.11 megacycles (16,110,000 cycles) per second, the main variable frequency oscillator 31 and the buffer amplifier 32 are tuned to 16.11 megacycles per second. The spectrum generator 18 and filter 28, however, remain tuned at 20.5 megacycles per second, since they can be varied only in 100 kilocycle steps. Consequently, the first IF is 4.390 megacycles per second (20,500,000 cycles minus 16,110,000 cycles). The first IF of 4.390 megacycles per second is mixed with the output of the 10 kilocycle loop, whose variable frequency oscillator 35 frequency was changed by the 10 kilocycle control 25 to 3.990 megacycles per second. This produces a second IF of 400 kilocycles per second (4,390,000 cycles per second minus 3,990,000 cycles per second) which is compared with the unchanged 400 kilocycle per second output of the one kilocycle loop and the main variable frequency oscillator 31 is disciplined by the output of the phase detector 68.

When the desired or selected frequency is changed to 16.111 megacycles (16,111,000 cycles) per second, the main variable frequency oscillator 31 and the buffer amplifier 32 are tuned to 16.111 megacycles per second. The spectrum generator 18 and filter 28 are still tuned at 20.5 megacycles per second, so that the first IF is 4.390 megacycles per second ±5 kilocycles per second (20.5 megacycles minus 16.111 megacycles ±5 kilocycles). The 10 kilocycle loop output frequency remains unchanged at 3.990 megacycles per second and the resultant IF is 400 kilocycles per second ±5 kilocycles. However, adjustment of the one kilocycle front panel control 24 lowers the one kilocycle loop variable frequency oscillator 51 frequency to 3.990 megacycles per second which is divided by the locked divider 54 set by said one kilocycle control to 399 kilocycles per second. The first and second IF's of 400±5 kilocycles per second and 399 kilocycles per second are supplied to the phase detector 68 and the resultant D.C. output phase locks the main variable frequency oscillator 31, through the reactance control 72 to the selected frequency.

To raise the 16.111 megacycle per second frequency output by 100 cycles, i.e., to 16,111,100 cycles per second, the settings and internal frequencies are substantially the same as for an output frequency of 16.111 megacycles per second. The cycles control 23, however, is adjusted to the final three digits of the frequency. This results in the variation of the output frequency of the reference oscillator 13 (one megacycle) and the shifting of the 100 kilocycle pulses derived from said reference oscillator in frequency. Since the output frequency at the terminal 34 is changed by 100 cycles, the pulses derived from the reference oscillator 13 must be varied by 100 kilocycles divided by 100 cycles or 1000 cycles per second. Furthermore, since the output is already set at 16.111 megacycles per second, the frequency of the reference oscillator 13 must actually be varied by the ratio of 1000 cycles to 16.111 megacycles or approximately 62.1 cycles per second. The null control 22 varies the output frequency of the reference oscillator 13 by the correct amount as set by the cycles control 23.

Should the 10 kilocycle control 25 be changed, the null bridge 81 must be rebalanced. Suppose that the 10 kilocycle control 25 changes the output frequency from 16,111,100 cycles per second to 31,111,100 cycles per second. Thus, the reference oscillator 13 must actually be varied by the ratio of 1000 cycles to 31.111 megacycles or approximately 32.2 cycles per second to maintain the 100 cycle setting, regardless of the coarse adjustment of frequency. To achieve this, the readjustment of the 10 kilocycle control 25 necessitates the rebalancing of the null bridge 81 through the null control 22, leaving the cycles control 23 unchanged, to adjust the change in the reference oscillator 13 frequency for 31.25 cycles, instead of 62.5 cycles, thereby maintaining the same 100 cycle setting. In the frequency range of the radio frequency oscillator of the present disclosure, which is 16 to 32 megacycles per second, to maintain a 100 cycle reading, the reference oscillator 13 must be varied by the null control 22 to a position varied by an amount in the range of 31.25 to 62.5 cycles. Consequently, to maintain a 200 cycle reading, the reference oscillator 13 should be shifted by an amount in the range of 15.625 to 31.25 cycles, depending upon the setting of the 10 kilocycle control 25.

It is thus seen that the rotary switches 36, 52, and 69 come into operation when the desired output frequency includes a decimal portion of a megacycle. This is achieved by the gear arrangement 91.

The 10 kilocycle control 25 controls all frequencies between 16 and 32 megacycles per second in 10 kilocycle (10,000 cycle) increments. The one kilocycle control 24 controls all frequencies between 16 and 32 megacycles per second in increments of 1000 cycles.

It is understood that the exemplary embodiment of this invention disclosed herein is not to be considered as restrictive to any degree and that this invention is limited only by the scope of the claim appended hereto.

What is claimed is:

A multichannel frequency synthesizer, comprising:

a reference generator, including a reference oscillator and a regenerative frequency divider, producing a stable reference frequency;

a frequency controlled spectrum generator coupled to said frequency generator to produce a spectrum of the harmonics of said reference frequency within a preselected range;

first, second and third oscillators generating signals, the frequencies of two of which are controlled at rates related in a predetermined geometric relationship;

first mixer means coupled to said spectrum generator and said first oscillator to receive the outputs therefrom;

second mixer means coupled to receive the output from said first mixer means and from said second oscillator;

first, second and third frequency lock means respectively connected to said first, second and third oscillators, said frequency lock means comprising phase detector means coupled to said oscillators by voltage sensitive reactances, which reactances cause said oscillators to change in frequency so long as a DC phase error voltage is generated by said phase detector means;

first and second sweep generators connected to said second and third frequency lock means to provide a voltage sweep to ensure lock-in of said second and third oscillators;

the phase detector means of said second frequency lock means being coupled to receive the outputs from said spectrum generator and said second oscillator to detect the phase difference between these two signals and generate a DC error signal in proportion thereto;

the phase detector means of said third frequency lock means being coupled to receive the outputs from said spectrum generator and said third oscillator to detect the phase difference between these two signals and generate a DC error signal in proportion thereto;

frequency controlled divider means coupled to said third oscillator to reduce the frequency of the signal received therefrom to that of the signal from said second mixer means and applying this signal to the phase detector of said first frequency lock means;

said last recited phase detector also being coupled to receive the output from said second mixer means and generating a DC error signal in proportion to the difference in the phase between these two received signals, whereby the voltage sensitive reactance associated therewith is caused to correct and lock the frequency of said first oscillator to the desired synthesier output frequency;

and frequency selection means coupled to said reference oscillator, said spectrum generator, said first, second and third oscillators and said divider means to control the frequencies thereof;

said frequency selection means including a plurality of variable resistors connected to form a null indicating bridge, whereby any unbalance caused by frequency adjustment will be indicated by said bridge, which indicated unbalance may be then corrected by readjusting the frequency of said reference oscillator.

References Cited by the Examiner

UNITED STATES PATENTS

| | | | |
|---|---|---|---|
| 2,287,925 | 6/42 | White | 331—4 X |
| 2,888,562 | 5/59 | Robinson | 331—2 |
| 2,964,714 | 12/60 | Jakubowics | 331—2 |
| 2,964,715 | 12/60 | Winkler | 331—2 |

ROY LAKE, *Primary Examiner.*

JOHN KOMINSKI, *Examiner.*